(12) United States Patent
Buynoski

(10) Patent No.: US 6,376,336 B1
(45) Date of Patent: Apr. 23, 2002

(54) FRONTSIDE SOI GETTERING WITH PHOSPHORUS DOPING

(75) Inventor: Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/775,215

(22) Filed: Feb. 1, 2001

(51) Int. Cl.[7] .............................................. H01L 21/322
(52) U.S. Cl. ...................................................... 438/476
(58) Field of Search ................................. 438/471, 472, 438/473, 474, 475, 476, 477

(56) References Cited

U.S. PATENT DOCUMENTS

| | | |
|---|---|---|
| 3,936,858 A | 2/1976 | Seeds et al. |
| 4,498,227 A | 2/1985 | Howell et al. |
| 5,194,395 A | 3/1993 | Wada |
| 5,244,819 A * | 9/1993 | Yue |
| 5,272,104 A | 12/1993 | Schrantz et al. |
| 5,443,661 A | 8/1995 | Ogura et al. |
| 5,453,153 A | 9/1995 | Fan et al. |
| 5,501,993 A | 3/1996 | Borland |
| 5,646,053 A | 7/1997 | Schepis et al. |
| 5,753,560 A | 5/1998 | Hong et al. |
| 5,773,152 A | 6/1998 | Okonogi |
| 5,795,809 A | 8/1998 | Gardner et al. |
| 5,807,771 A | 9/1998 | Vu et al. |
| 5,818,085 A | 10/1998 | Hsu et al. |
| 5,882,990 A | 3/1999 | DeBusk et al. |
| 5,899,732 A | 5/1999 | Gardner et al. |
| 5,926,727 A | 7/1999 | Stevens et al. |
| 5,929,508 A | 7/1999 | Delgado et al. |
| 5,965,917 A | 10/1999 | Maszara et al. |
| 5,976,956 A | 11/1999 | Gardner et al. |
| 6,001,711 A * | 12/1999 | Hashimoto |
| 6,010,950 A | 1/2000 | Okumura et al. |
| 6,013,584 A | 1/2000 | M'Saad |
| 6,022,793 A | 2/2000 | Wijaranakula et al. |
| 6,024,888 A | 2/2000 | Watanabe et al. |
| 6,083,324 A | 7/2000 | Henley et al. |
| 6,093,624 A | 7/2000 | Letavic et al. |
| 6,100,202 A | 8/2000 | Lin et al. |
| 6,114,223 A | 9/2000 | Gonzalez et al. |
| 6,133,123 A | 10/2000 | Gonzalez |

OTHER PUBLICATIONS

"Basic Gettering Principles" (Crystalline Defects, Thermal Processing, and Gettering), *Silicon Processing For The VLSI Era*, Wolf and Tauber, vol. 1: Process Technology, pp. 63–70 (1986).

Improved SI–EPI–Wafers by Buried Damage Layer for Extrinsic Gettering; Dziesiatv and Wencel; Humboldt Univ. Of Berlin Section of Physics, unknown date.

Gettering Technique and Structure, IBM Technical Disclosure Bulletin 5/75.

"Nanoscale CMOS", *Proceedings of the IEEE*, Wong, et al., vol. 87, No. 4, Apr. 1999.

* cited by examiner

*Primary Examiner*—Keith Christianson
(74) *Attorney, Agent, or Firm*—Renner, Otto, Boisselle & Sklar LLP

(57) ABSTRACT

The present invention relates to a method of manufacturing a silicon-on-insulator semiconductor wafer, including the steps of (1) forming a silicon-on-insulator semiconductor wafer having at least one surface of a monocrystalline silicon film; (2) contacting the at least one surface with phosphorus ions to form a doped region of the monocrystalline silicon film doped with phosphorus above a region of the monocrystalline silicon film which remains undoped; (3) subjecting the wafer to conditions to getter at least one impurity from the undoped region into the doped region; and (4) removing a portion of the monocrystalline silicon film including the doped region from the at least one surface, leaving a substantial portion of the monocrystalline silicon film.

20 Claims, 2 Drawing Sheets

FRONTSIDE SOI GETTERING WITH PHOSPHORUS DOPING

TECHNICAL FIELD

The present invention generally relates to making silicon-on-insulator (SOI) semiconductor wafers, and in particular to a method and a system for gettering impurities from a monocrystalline silicon active layer or film including the use of a phosphorus doping of the SOI wafer.

BACKGROUND OF THE INVENTION

Recently, semiconductor-on-insulator (SOD) wafers increasingly have been used in very-large scale integration (VLSI) or ultra-large scale integration (ULSI) of semiconductor devices. An SOI wafer typically has a layer of silicon on top of a layer of an insulator material. In an SOI integrated circuit, essentially complete device isolation may be achieved using conventional device processing methods by surrounding each device, including the bottom of the device, with an insulator. One advantage which SOI wafers have over bulk silicon wafers is that the area required for isolation between devices on an SOI wafer is less than the area typically required for isolation on a bulk silicon wafer.

SOI offers other advantages over bulk silicon technologies as well. For example, SOI offers a simpler fabrication sequence compared to a bulk silicon wafer. Devices fabricated on an SOI wafer may also have better radiation resistance, less photo-induced current, and less cross-talk than devices fabricated on bulk silicon wafers. Some limitations still exist with the fabrication of SOI wafers. For example, devices within integrated circuits in SOI wafers are very sensitive to the presence of even minute concentrations of some impurities. For example, metals, such as copper, nickel, silver, gold, or iron, within the active region of a device typically degrade several device characteristics, including leakage current and oxide breakdown voltage. These and other metals rapidly diffuse through silicon at temperatures typical of semiconductor device fabrication processes. These impurities may come to reside in the active region of the SOI wafer from, e.g., contamination during processing from sources such as equipment. The insulation region tends to block impurities from diffusing out of the active layer into the bulk silicon beneath the insulation region. Accordingly, SOI wafers are subject to device and reliability problems caused by the presence of impurities that remain in the active region.

Methods of gettering a silicon substrate are well known. Gettering is used to remove contaminants (usually heavy metals) from regions of the circuit where their presence would degrade device performance. Most all the transition metals, such as gold, copper, iron, titanium, nickel, etc., have been reported as contaminants. It is desirable to reduce the presence of such contaminants in the active regions in order to, for example, reduce reverse junction leakage, improve bipolar transistor gain and increase refresh time in dynamic metal oxide semiconductor (MOS) memories. There are two common forms of gettering: intrinsic gettering and extrinsic gettering.

Intrinsic gettering involves forming gettering sites in the bulk of a semiconductor substrate, generally below the active regions near the frontside surface of the semiconductor substrate. In silicon substrates (wafers) manufactured using the Czochralski (Cz) method, intrinsic gettering generally includes an initial denuding step (for wafers without silicon epitaxial layers) followed by a nucleation step, and then a precipitation step. Denudation, nucleation, and precipitation, in combination, form lattice dislocations in the silicon bulk below the active regions. The dislocations serve to trap heavy metal ions at the dislocation sites, away from the overlying active regions.

Extrinsic gettering, on the other hand, generally involves gettering near the backside surface of a silicon substrate. There are several methods used to perform extrinsic gettering. Two common methods include (i) diffusing phosphorous into the backside surface of a silicon wafer, and/or (ii) depositing polycrystalline silicon (polysilicon) on the backside surface of a silicon wafer. Diffusion processes utilizing extrinsic gettering techniques such as backside phosphorous diffusion and polysilicon deposition are described in Runyan, et al., Semiconductor Integrated Circuit Processing Technology, (Addison-Wesley Publishing Co., 1990), pp. 428–442; and, DeBusk, et al., "Practical Gettering in High Temperature Processing", Semiconductor International, (May 1992) (both of which are herein incorporated by reference for their teachings relating to gettering).

Extrinsic gettering has been applied to the frontside surface of polycrystalline silicon wafers, in which phosphorus doping of contact layers is used to obtain frontside (or topside) gettering of diffused impurities or contaminants.

In SOI wafer technology, however, the use of polysilicon in direct contact with the back of the SOI wafer is not an effective gettering scheme, since the buried oxide layer will act as a diffusion barrier, causing contaminants to become trapped in the SOI film. The use of topside gettering by phosphorus doping of contact layers has not been effective in SOI technology due to the fact that it has been applied late in the fabrication process and thus cannot prevent contamination during earlier stages of the process, and being applied late in the fabrication process, it can only protect accessible portions of the top surface of the circuit, leaving access for contaminants which later migrate from other portions covered by device elements and from which the impurities cannot directly be gettered.

Since SOI wafers do not getter well by known gettering methods due to the presence of the buried oxide, a gettering method applicable to SOI wafers in an early stage of the production of such wafers has been sought.

SUMMARY OF THE INVENTION

A method of extrinsic gettering of the surfaces of SOI wafers is the subject of this application. In one embodiment, the method is applied to the frontside, i.e., monocrystalline silicon film, surface of the SOI wafer. In one embodiment, the method is applied to both the frontside and the backside of the SOI wafer.

In one embodiment, the present invention relates to a method of manufacturing a silicon-on-insulator semiconductor wafer, including the steps of:

forming a silicon-on-insulator semiconductor wafer having at least one surface of a monocrystalline silicon film;

subjecting the at least one surface to phosphorus ions to form a doped region of the monocrystalline silicon film doped with phosphorus above an undoped region of the monocrystalline silicon film;

subjecting the wafer to conditions to getter at least one impurity from the undoped region into the doped region;

removing the doped region and a portion of the undoped region from the surface, leaving a substantial portion of the monocrystalline silicon film.

In one embodiment, the phosphorus ions are obtained from a source of phosphorus selected from phosphorus oxychloride, $POCl_3$, phosphine ($PH_3$), trimethyl phosphite, $P(OCH_3)_3$, triethyl phosphite, $P(OCH_2CH_3)_3$, trimethyl phosphate, $P(O)(OCH_3)_3$ and triethyl phosphate, $P(O)(OCH_2CH_3)_3$. In one embodiment, the step of contacting includes formation of a layer of $P_2O_5$ on the at least one surface.

In one embodiment, after gettering the layer of $P_2O_5$ is removed by etching with an etchant comprising fluorine. In one embodiment, the etchant comprises hydrogen fluoride.

In one embodiment, the portion of the monocrystalline silicon film is removed by chemical mechanical polishing. In one embodiment, the monocrystalline silicon film has an initial thickness in excess of a predetermined final thickness. In one embodiment, removal of the portion of the monocrystalline silicon film leaves a predetermined final thickness of the monocrystalline silicon film. In one embodiment, the portion of the monocrystalline silicon film removed includes the doped region and a portion of the undoped region.

In one embodiment, the present invention relates to a method of manufacturing a silicon-on-insulator semiconductor wafer, comprising the steps of:

forming a silicon-on-insulator semiconductor wafer having at least one surface of a monocrystalline silicon film, wherein the monocrystalline silicon film has an initial thickness in excess of a predetermined final thickness;

subjecting the at least one surface to phosphorus ions to form a doped region of the monocrystalline silicon film doped with phosphorus above an undoped region of monocrystalline silicon film;

subjecting the wafer to conditions to getter at least one impurity from the undoped region into the doped region;

removing the doped region and a portion of the undoped region from the surface, leaving the predetermined final thickness of the monocrystalline silicon film.

In another embodiment, the present invention relates to a method of manufacturing a silicon-on-insulator semiconductor wafer, comprising the steps of:

forming a silicon-on-insulator semiconductor wafer having at least one surface of a monocrystalline silicon film, wherein the monocrystalline silicon film has an initial thickness in excess of a predetermined final thickness, and the monocrystalline silicon film contains an initial concentration of at least one impurity;

subjecting the at least one surface to phosphorus ions to form a doped region of the monocrystalline silicon film doped with phosphorus above an undoped region of the monocrystalline silicon film;

subjecting the wafer to conditions to getter the at least one impurity from the undoped region into the doped region;

removing the doped region and a portion of the undoped region from the surface, leaving the predetermined final thickness of the monocrystalline silicon film, wherein the final thickness of the monocrystalline film contains a concentration of the at least one impurity substantially lower than the initial quantity of the at least one impurity.

Thus, the present invention provides a method for gettering an SOI wafer which addresses and overcomes the limitations of the prior art.

DETAILED DESCRIPTION

In the first step of the method of the present invention, a silicon-on-insulator (SOI) semiconductor wafer having at least one surface of a monocrystalline silicon film is provided. As used herein, the term "monocrystalline" implies a crystal lattice structure substantially without defects in the crystal structure and containing few impurities. The SOI wafer may be formed by any technique for forming such wafers, as described more fully below.

As used herein, the term "impurity" refers to atoms or molecules which are not intended to be present in the particular semiconductor material. As used herein, an impurity does not include atoms or molecules which have been intentionally added to a semiconductor material and are intended to have a function in the semiconductor material, for example, as a dopant. Impurities, as used herein, are generally substances the presence of which may result in deleterious or unwanted effects in the performance of the semiconductor device in which such impurity may reside.

Figure 1:
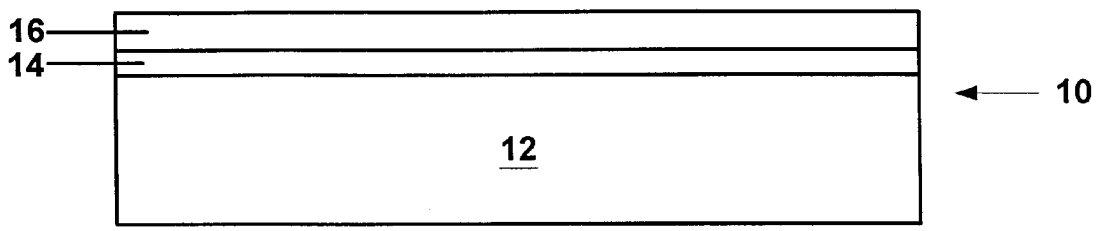
FIG. 1 is a partial cross-sectional view of an SOI wafer.

FIG. 1 shows a partial cross-sectional view of an SOI wafer 10, with a silicon substrate 12, a buried oxide layer 14 and a silicon film 16. The silicon film 16 contains at least one impurity. The impurity may comprise, e.g., metal atoms, as more fully described below. The impurity, which may be distributed throughout the monocrystalline silicon film 16, is not shown in FIG. 1. In one embodiment, the silicon film 16 is a monocrystalline silicon film.

The SOI wafer 10 may be formed by any method known in the art. In one embodiment the SOI wafer 10 is formed by wafer bonding. In a wafer bonding process, oxide layers are grown on a surface of each of two silicon wafers. The oxide layers should be as clean and smooth as possible. In one embodiment, at least one of the silicon wafers is a monocrystalline silicon wafer. One of the monocrystalline silicon wafers has a zone of weakness in a plane parallel to the surface upon which the oxide was grown. The zone of weakness may be created by any method known in the art, for example, by a process of implantation of, e.g., hydrogen which may form a layer of hydrogen gas bubbles, in a process known as "Smart-Cut". Other known methods of forming the zone of weakness may be employed, such as implantation of species other than hydrogen. The clean and smooth oxide layers of the two silicon wafers are placed together. Heat and pressure are applied to form a bond between the oxide layers, thus forming a single oxide layer buried between the silicon layers, which forms the buried oxide layer of the nascent SOI wafer.

The zone of weakness is broken, by application of heat or mechanical pressure, whereupon the bulk of the silicon wafer having the zone of weakness is removed, leaving a relatively thin silicon film from which the silicon active layer will be formed. The nascent SOI wafer may then be annealed, which results in full fusion of the oxide layers and removes crystalline defects from the monocrystalline silicon film. In one embodiment, the foregoing process is used to form the SOI wafer 10.

In one embodiment, the SOI wafer may be formed by creating a buried oxide layer by implantation of oxygen into a single silicon wafer. This process is known as SIMOX (separation by implanted oxygen). The oxygen may be implanted into one surface of a monocrystalline silicon wafer by any standard technique, to a depth necessary to leave a thin silicon film on the surface. As a result of implantation of the oxide, the silicon film may have been damaged. Thus, in one embodiment, the nascent SOI wafer is annealed to remove defects from the resulting monocrystalline silicon film 16. In one embodiment, the foregoing process is used to form the SOI wafer 10.

In one embodiment, the SOI wafer is a silicon-on-sapphire (SOS) wafer. In one embodiment, the SOI wafer is made by a zone-melting-and-recrystallization (ZMR) method. In one embodiment, the SOI wafer is made by a bond-and-etch-back SOI (BESOI) method.

The SOI wafer 10 used in the present invention may be any SOI wafer formed by any of the above-mentioned techniques for forming SOI wafers, or by any other method of forming SOI wafers. The present invention, as described herein, is applied to a previously formed SOI wafer, and thus is not limited to any particular method of forming the SOI wafer. More detailed descriptions of the foregoing methods of formation of SOI wafers may be found, for example, in Kuo, James B. and Ker-Wei Su, "CMOS VLSI Engineering Silicon-on-Insulator (SOD", Kluwer Academic Publishers, 1998. This publication is incorporated herein by reference for its teachings of methods of formation of SOI wafers.

In the second step of the method of the present invention, at least one surface of the SOI wafer is contacted with phosphorus. This contact results in the formation of a doped region in the monocrystalline silicon film, in which the doped region is doped with phosphorus atoms. The remainder of the monocrystalline silicon film remains free of doping by phosphorus.

In one embodiment, the SOI wafer is contacted with phosphorus by exposing the SOI wafer 10, or by exposing at least the surface of the monocrystalline silicon film 16, to an atmosphere containing phosphorus oxychloride, $POCl_3$, at a temperature in the range from about 800° C. to about 1200° C. In one embodiment, the temperature of the atmosphere containing $POCl_3$ is in a range from about 850° C. to about 1100° C. In one embodiment, the temperature of the atmosphere containing $POCl_3$ is about 900° C. The atmosphere containing $POCl_3$ may contain from about 10% to about 100% $POCl_3$. In one embodiment, the atmosphere containing $POCl_3$ may contain from about 30% to about 70% $POCl_3$. In embodiments in which the $POCl_3$ content of the atmosphere containing $POCl_3$ is less than 100% $POCl_3$, the remainder of the atmosphere may contain an inert gas such as nitrogen, helium, argon, neon, krypton or xenon.

Figure 2:
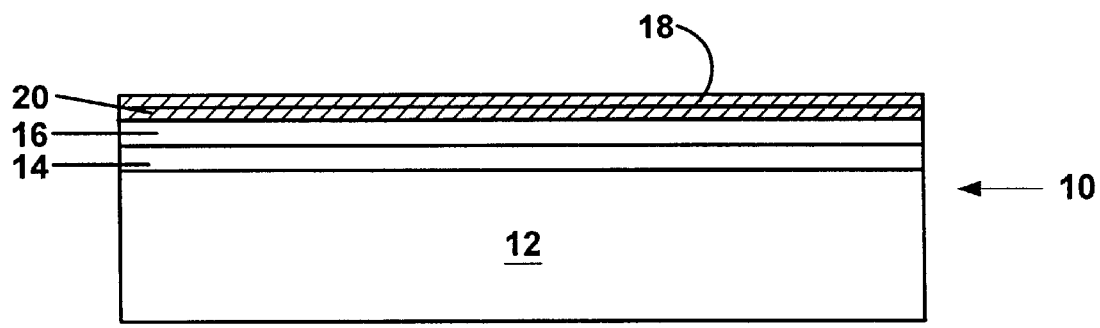
FIG. 2 is a partial cross-sectional view of an SOI wafer following contacting the surface of the SOI wafer with phosphorus in accordance with one embodiment of the present invention, in which a phosphorus-containing layer is formed.

These conditions result in doping of the monocrystalline silicon film 16 with phosphorus as shown in FIG. 2. These conditions may result in the formation of a phosphorus-containing layer 18 on the surface of the monocrystalline silicon film, or on other surfaces of the SOI wafer which are exposed to these conditions. These conditions result in the formation of a doped region 20. The phosphorus-containing layer may be quite thin, e.g., from about 50 Å to about 200 Å in thickness.

In one embodiment, these conditions result in the formation of a phosphorus-containing layer 18 comprising phosphorus pentoxide, $P_2O_5$. In one embodiment, these conditions result in the formation of a phosphorus-containing layer 18 consisting essentially of phosphorus pentoxide, $P_2O_5$.

In one embodiment, the $POCl_3$ reacts with hydrogen atoms exposed on the surface of the monocrystalline silicon film, forming the phosphorus-containing layer 18 of $P_2O_5$ and releasing HCl as a by-product. In one embodiment, when oxides of silicon are present on the surface of the monocrystalline silicon film, a glass such as PSG may be formed.

In one embodiment, the time for which the SOI wafer 10 is contacted with phosphorus by exposing the SOI wafer 10, or by exposing at least the surface of the monocrystalline silicon film, to an atmosphere containing $POCl_3$ is sufficiently long to obtain a doped region 20 having a desired, predetermined depth of phosphorus doping into the monocrystalline silicon film 16. In one embodiment, the time of exposure is in the range from about 5 minutes to about 120 minutes. In one embodiment, the thickness of the doped region 20 on the monocrystalline silicon film 16 is in the range from about 0.1 to about 1 micron. In one embodiment, the thickness of the doped region 20 on the monocrystalline silicon film 16 is in the range from about 0.5 to about 0.9 micron. In one embodiment, the thickness of the doped region 20 on the monocrystalline silicon film 16 is in the range from about 0.3 to about 0.8 micron.

The phosphorus-containing layer 18 may also be formed by one of the known CVD processes. In one embodiment, a phosphorus-containing layer 18 is applied by atmospheric chemical vapor deposition (APCVD). In one embodiment, a phosphorus-containing layer 18 is applied by low pressure chemical vapor deposition (LPCVD). In one embodiment, a phosphorus-containing layer 18 is applied by plasma enhanced chemical vapor deposition (PECVD). In one embodiment, a phosphorus-containing layer 18 is applied by sub-atmospheric pressure thermal chemical vapor deposition (SACVD). Sources of phosphorus for these CVD processes include, for example, phosphorus oxychloride, $POCl_3$, phosphine ($PH_3$), trimethyl phosphite, $P(OCH_3)_3$, triethyl phosphite, $P(OCH_2CH_3)_3$, trimethyl phosphate, $P(O)(OCH_3)_3$ and triethyl phosphate, $P(O)(OCH_2CH_3)_3$. In one embodiment, the phosphorus-containing layer 18 is formed by a process including introduction of a process gas into a processing chamber, in which the process gas includes $PH_3$, $O_2$, and argon. The temperature is controlled between about 400° C. and about 650° C. during the deposition. The pressure in the chamber is maintained between about 1–10 millitorr (about 0.13 Pa to about 1.3 Pa). As a result, a phosphorus-containing layer is formed on the silicon film.

In one embodiment, the time for which the SOI wafer 10 is contacted with phosphorus by exposing the SOI wafer 10, or by exposing at least the surface of the monocrystalline silicon film 16, to an atmosphere containing $POCl_3$ is sufficiently long to obtain a desired, predetermined thickness of the phosphorus-containing layer 18 of $P_2O_5$ on the surface of the monocrystalline silicon film. In one embodiment, the time of exposure is in the range from about 10 minutes to about 200 minutes.

FIG. 2 shows a partial cross-sectional view of the SOI wafer 10 following the application of a phosphorus-containing layer 18 over the silicon surface 16. In one embodiment, the phosphorus-containing layer 18 constitutes a gettering layer. The phosphorus-containing or gettering layer 18 contains gettering sites, i.e., dislocations or defects, which constitute sites at which impurities are gettered together in the gettering step. During one or more of application of the phosphorus-containing layer 18, subsequent annealing steps and gettering steps, a portion of the phosphorus in the phosphorus-containing layer 18 may diffuse into the silicon surface 16, and thereby form a doped region 20 from an upper portion of the silicon surface 16. In one embodiment, the doped region 20 forms a portion of a gettering layer, together with the phosphorus-containing layer 18. Thus, in this embodiment, the doped region 20 contains gettering sites, as described above, at which impurities are gettered together in the gettering step. In general, formation of the phosphorus-containing layer results in formation of at least one gettering site. The gettering sites are not shown in the drawing figures, due to the nature of the sites.

The concentration of phosphorus in the phosphorus-containing layer 18 may be as high as the stoichiometric amount of phosphorus in $P_2O_5$, when the phosphorus-containing layer 18 consists essentially of $P_2O_5$. In an embodiment in which the phosphorus-containing layer 18 comprises $P_2O_5$, the content of $P_2O_5$ may range from about 10% by weight to 100% by weight of the phosphorus-containing layer 18. Of course, $P_2O_5$ is extremely hygroscopic, so once a phosphorus-containing layer 18 which comprises a large amount of $P_2O_5$ is exposed to any source of water, including ordinary atmospheric air, the $P_2O_5$ absorbs water, forming, e.g., phosphoric acid, $H_3PO_4$, in which the phosphorus content is reduced as compared to $P_2O_5$.

The concentration of phosphorus in the doped region 20, in one embodiment exceeds $1 \times 10^{20}/cm^3$. In one embodiment, the concentration of phosphorus in the doped region 20 is in the range from about $1 \times 10^{19}/cm^3$ to about $5 \times 10^{21}/cm^3$. In one embodiment, the concentration of phosphorus in the doped region 20 is in the range from about $5 \times 10^{20}/cm^3$ to about $5 \times 10^{21}/cm^3$. The concentration of phosphorus in the doped region 20, together with the phosphorus-containing layer 18, should provide a sufficient number of gettering sites so that substantially all of the impurities present in the monocrystalline silicon film can be captured by the gettering sites.

The phosphorus-containing layer 18 and the phosphorus-doped region 20 contain gettering sites. In essence, the entirety of the phosphorus-containing layer 18 is a gettering site. The phosphorus doped region 20 comprises a plurality of gettering sites. The gettering sites may be formed by, e.g., dislocations in the monocrystalline silicon film, by phosphorus-vacancy complexes and misfit dislocations.

In one embodiment, the gettering sites in the doped region 20 are constituted by dislocations in the monocrystalline silicon film. When the gettering sites are constituted by dislocations in the monocrystalline silicon film, the dislocations may be formed in the range of about $1 \times 10^{20}/cm^3$ to about $1 \times 10^{21}/cm^3$ or higher. The dislocations are formed in the portion of the monocrystalline silicon film which will be removed subsequently.

In the third step of the method of the present invention, the SOI wafer 10 including the phosphorus-containing layer 18 is subjected to gettering conditions in order to getter impurities from the monocrystalline silicon film 16 into the phosphorus-containing layer 18 and into the doped region 20. In the gettering step of the present invention, the SOI wafer 10 with the phosphorus-containing layer 18, the doped region 20, the monocrystalline silicon film 16 and, in one embodiment, the semiconductor wafer as a whole, are subjected to temperatures in the range from about 800° C. to about 1200° C. for periods of about 1 to about 120 minutes, in order to cause impurities, such as metal ions, in the thin silicon film to migrate into the phosphorus-containing layer. While the step of subjecting the SOI wafer to gettering conditions possibly may be carried out for longer periods of time or at lower temperatures, such processes are generally economically impractical. In one embodiment, the gettering step is carried out in an inert atmosphere to ensure the surfaces of the silicon wafer are not oxidized. In one embodiment, the gettering step is carried out in nitrogen. In one embodiment, the gettering step is carried out in argon. In one embodiment, the gettering is carried out in air. In one embodiment, the gettering is carried out in an oxidizing atmosphere. In one embodiment, the gettering step is carried out at atmospheric pressure. In one embodiment, the gettering step is carried out at sub-atmospheric pressure.

The gettering step results in the migration of isolated impurity atoms or molecules into gettering sites in the phosphorus-containing layer 18. In one embodiment, the gettering step results in the migration of isolated impurity atoms or molecules into gettering sites in the phosphorus-containing layer 18 and into the doped region 20. The gettering sites, as is known in the art, include, e.g., dislocations and other crystal defect sites existing in the doped region 20, and in the phosphorus-containing layer 18 generally.

Figure 3:
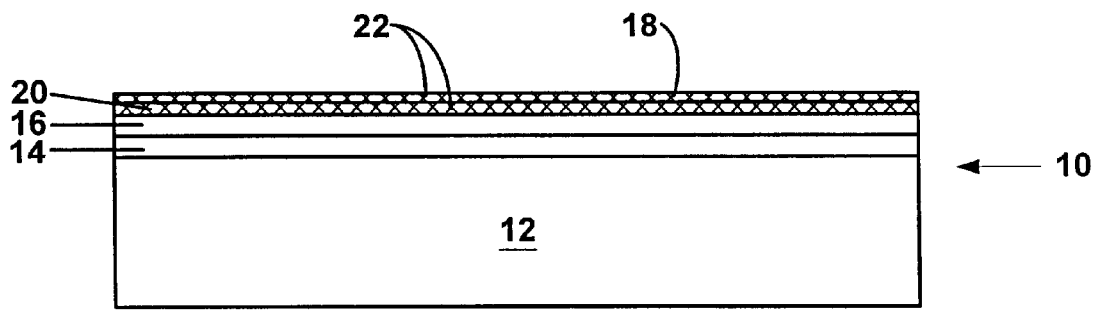
FIG. 3 is a partial cross-sectional view of an SOI wafer following a gettering step in accordance with the present invention.

FIG. 3 shows a partial cross-sectional view of the SOI wafer 10 following a gettering step, in which at least one impurity 22 has diffused from the silicon film 16 into the phosphorus-containing layer 18 and into the doped region 20. In one embodiment, a portion of the at least one impurity is contained in the doped region 20 after the gettering step. In one embodiment, substantially all of the at least one impurity is gettered into the phosphorus-containing layer 18. Thus, as a result of the gettering, the impurities 22 which previously existed in the silicon film 16 have been gettered into the phosphorus-containing layer 18, and in one embodiment have been gettered also into the doped region 20. The impurities 22 shown in FIG. 3 schematically represent the gettered impurity atoms or molecules which have gathered (or, gettered) together at the sites indicated.

In one embodiment, the second and third steps occur substantially simultaneously. That is, the second step, applying the phosphorus-containing layer to the at least one surface to form a gettering site, and the third step, subjecting the wafer to conditions to getter at least one impurity from the monocrystalline silicon film into the gettering site, occur together, under the same conditions. The term "substantially simultaneously" means that the step of forming a gettering site is not detectably separate from the step of subjecting the wafer to gettering conditions. In one embodiment, the second and third steps occur during the same processing step. The phrase "during the same processing step" means that the conditions under which the phosphorus-containing layer is formed are essentially the same conditions to getter the at least one impurity from the monocrystalline silicon film into the gettering site, and that carrying out the second step results in carrying out the third step. In this context, it should be understood that a gettering site must exist before an impurity may be captured by the gettering site. However, the migration of the impurities, which eventually results in the impurity "finding" and being "captured by" a gettering site, may be considered to co-occur with the formation of the gettering sites. In one embodiment, when the phosphorus-containing layer is formed by the reaction of $POCl_3$ with oxygen at a temperature of about 800° C. to about 1200° C., gettering takes place substantially simultaneously, or during the same processing step.

In one embodiment, the second step and the third step occur sequentially. In an embodiment in which the step of formation of the phosphorus-containing layer occurs at a temperature lower than a temperature which results in gettering, the third step is performed by subsequently raising the temperature to a temperature at which gettering takes place. Thus, in this embodiment, the third step may be undertaken at a later time and/or in a separate apparatus. In one embodiment, when the phosphorus-containing layer is formed by one of the aforementioned CVD methods, the temperature of the CVD may be lower than needed for gettering to take place, in which case the third step is a separate step from the second step. In one embodiment, the second and third steps take place sequentially, with both steps taking place in the same apparatus, but under different conditions. For example, following formation of a phosphorus-containing layer by a CVD process at a temperature which does not result in gettering, without removing the SOI wafer from the CVD apparatus, the temperature may be increased to a temperature at which gettering takes place.

A temperature at which gettering takes place ranges from about 800° C. to about 1200° C. In one embodiment, the temperature at which gettering takes place is in the range from about 900° C. to about 1100° C. The exact temperature at which gettering takes-place depends upon the impurities which are to be gettered. Since gettering is a process of moving impurity atoms or ions through the crystal lattice of the monocrystalline silicon film, the rate at which the impurities move is a function of both the temperature and the solubility of the impurities in the silicon. Thus, the exact temperature at which gettering takes place depends upon the particular impurities which are desired to be gettered, as will be understood by those of skill in the art. Such persons can easily determine the exact conditions at which the desired gettering takes place.

The impurities which may be gettered include metals. In one embodiment, the metals include the transition metals. In one embodiment, the metals include heavy metals. In one embodiment, the metals which may be gettered include heavy metals, such as nickel, palladium, platinum, copper, silver, gold, palladium, ruthenium, chromium, tantalum, iron, cobalt, tungsten, lead, zinc, tin, zirconium, titanium, vanadium, manganese, aluminum, niobium and tantalum. In one embodiment, the metallic impurities may include compounds of the foregoing metals, such as oxides or sulfides.

The concentration of the impurities which are to be gettered range from about $1 \times 10^{11}/cm^3$ to about $1 \times 10^{17}/cm^3$ or higher. The level of impurities prior to gettering depends on, e.g., the cleanliness of the process by which the SOI wafer is produced.

Following the gettering, the concentration of the impurities in the active region of the SOI wafer should be reduced close to a level at which they are not detectable. In one embodiment, the at least one impurity is not detectable in the monocrystalline silicon film following the gettering step. In one embodiment, the concentration of the at least one impurity is reduced to about $1 \times 10^8/cm^3$ to about $1 \times 10^{10}/cm^3$ by the gettering step. In one embodiment, a plurality of impurities are gettered during the step of subjecting the SOI wafer to gettering conditions. In one embodiment, the concentration of each the plurality of impurities is reduced to about $1 \times 10^8/cm^3$ to about $1 \times 10^{10}/cm^3$ by the gettering step. Due to inherent differences in the diffusibility of impurities, the reduction in concentration of various impurities is likely to vary.

As will be understood by those of skill in the art, the lower limit, of detection of a given impurity depends on the sensitivity of available analytical techniques applicable to that impurity, which varies for different impurities. Thus, future advances in analytical techniques may allow detection of much lower levels of impurities. In addition, as will be understood by those of skill in the art, the degree of reduction of the concentration of a given impurity depends on the relative solubility and diffusibility of that impurity in the monocrystalline silicon film.

In the fourth step of the method of the present invention, the phosphorus-containing layer is removed and a portion of the monocrystalline silicon film is removed, leaving a substantial portion of the monocrystalline silicon film. The portion of the wafer 10 removed may comprise the doped region 20 and may further comprise a portion of the undoped silicon film 16. In one embodiment, the removal of the phosphorus-containing layer 18 is performed in a separate step from the removal of the doped region 20 and the portion of the monocrystalline silicon film 16.

In one embodiment, the phosphorus-containing layer 18 is removed by etching with an etchant. In one embodiment, the phosphorus-containing layer 18 is removed by chemical mechanical polishing. In one embodiment, the etchant comprises fluorine. In one embodiment, the etchant comprises hydrogen fluoride. In one embodiment, an aqueous solution of HF is used as the etchant. In one embodiment the aqueous solution of HF is prepared by dissolving from about 0.1 part to about 10 parts HF in about 30 parts of water.

In one embodiment, the phosphorus-containing layer 18 is removed by etching in an atmosphere of hydrogen fluoride, in which the concentration of water vapor is held at a minimum, in order to selectively etch the phosphorus-containing layer 18. In one embodiment, the concentration of water vapor in the etching atmosphere is held to less than about 1,000 ppm. In one embodiment, the concentration of water vapor in the etching atmosphere is held to less than about 100 ppm. In one embodiment, the concentration of water vapor in the etching atmosphere is held to less than about 10 ppm. In one embodiment, the concentration of water vapor in the etching atmosphere is held to less than about 5 ppm. In one embodiment, the concentration of water vapor in the etching atmosphere is held to less than about 1 ppm. In one embodiment, the concentration of water vapor in the etching atmosphere is held to less than about 0.1 ppm.

In one embodiment, the etching of the phosphorus-containing layer 18 is carried out in a hydrogen fluoride atmosphere at atmospheric pressure. In one embodiment, the etching is carried out in a hydrogen fluoride atmosphere at a sub-atmospheric pressure. In one embodiment, the etching is carried out in a hydrogen fluoride atmosphere at a pressure less than 5000 Pa. In one embodiment, the etching is carried out in a hydrogen fluoride atmosphere at a pressure less than 3000 Pa. In one embodiment, the etching is carried out in a hydrogen fluoride atmosphere at a pressure less than 1000 Pa.

In one embodiment, the etching is carried out in an atmosphere comprising fluorine gas and water vapor. In one embodiment, the HF is present at a partial pressure of about 300 Pa, while water is present at a partial pressure of about 600 Pa. In one embodiment, the HF is present at a partial pressure of from about 100 Pa to about 5000 Pa, while water is present at a partial pressure of from about 100 Pa to about 5,000 Pa. Other processes known in the art for etching phosphorus-containing may be used.

In one embodiment, the phosphorus-containing layer 18 is removed by another known method, such as chemical mechanical polishing (CMP). The CMP may be employed to remove simultaneously or in a continuous process, both the phosphorus-containing layer 18, the doped region 20 and a portion of the underlying silicon film 16, as described more fully below. Thus, in one embodiment, CMP is employed to remove first the phosphorus-containing layer 18, then the doped region 20 and then a portion of the silicon film, in one continuous CMP process. CMP is more fully described below.

Figure 4:
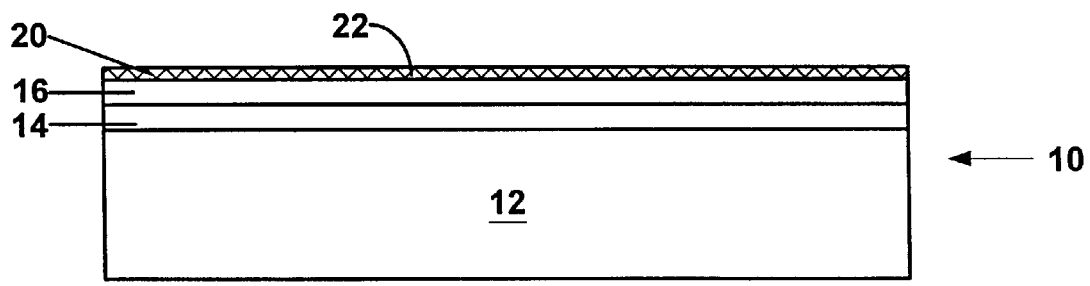
FIG. 4 is a partial cross-sectional view of an SOI wafer following an etching step, in which the phosphorus-containing layer has been etched away in accordance with the present invention.

FIG. 4 shows a partial cross-sectional view of the SOI wafer 10 following an etching step, in which the phosphorus-containing layer 18, with the gettered impurities 22 contained therein, has been etched away. As shown in FIG. 4, in the illustrated embodiment, the etching step removes primarily only the phosphorus-containing layer 18, along with the gettered impurities 22, but does not remove the silicon film 16 or the doped region 20 of the silicon film 16. As a result of the etching step, the gettered impurities 22 contained in the phosphorus-containing layer 18 have been removed from the SOI wafer 10 together with the phosphorus-containing layer 18.

In one embodiment, a portion of the monocrystalline silicon film 16 is removed by polishing. In one embodiment, the polishing is chemical mechanical polishing (CMP). In one embodiment, the CMP follows an etching step, in which the phosphorus-containing layer 18 is etched away. In one embodiment, mentioned above, the CMP used to remove a portion of the silicon film following removal of the doped region 20 also by CMP.

The CMP step is carried out by any CMP method known in the art. In general, CMP involves rotation of a wafer on a rotary platen in the presence of a polishing medium and a polishing pad that grinds (chips away) the surface material. In one embodiment, the polishing pad is mounted on a rotary platen which is counter-rotated with the rotary platen containing the wafer. In one embodiment, the polishing pad is in the form of a belt applied to the rotary platen upon which the wafer is mounted. The CMP process is actually considered to comprise two steps: step one consists of chemically modifying the surface of the material and then in the final step the altered material is removed by mechanical grinding. The CMP process should control the chemical attack of the substrate and the rate of the grinding, and should selectively remove only the desired layers of the wafer features without significant damage to the wafer features which are to be retained.

The polishing slurries used in CMP comprise an abrasive suspension (silica, alumina, etc.) usually in an aqueous medium. The aqueous medium may include a dispersion and/or a solution, including other chemical species. The type and size of the abrasive, the solution pH and presence of (or lack of) oxidants or other chemical agents are very important to the CMP process. In order to remove a portion of a silicon film by CMP, the pH of the aqueous medium should be relatively high, in the range from about 9.0 to about 14.0. In one embodiment, the pH of the aqueous medium used in CMP of the portion of the silicon film is in the range from about 10.0 to about 12.0. Those of skill in the art can appropriately select the CMP conditions for a given semiconductor wafer.

In one embodiment, the CMP process removes a portion of the silicon film which has become doped with phosphorus, i.e., the doped region 20. The phosphorus in the doped region 20 which has diffused into the doped region from the phosphorus-containing layer 18, conveniently may be termed "doped-in phosphorus." In one embodiment, the portion removed comprises the doped region 20. In one embodiment, the CMP removes only the portion of the silicon film 16, i.e., the doped region 20, which includes doped-in phosphorus. In one embodiment, the portion of the silicon film 16 removed includes the doped region 20 and a small portion of the monocrystalline silicon film 16 not doped with phosphorus. In one embodiment, the portion removed is the doped region 20 plus a small amount of the monocrystalline silicon film 16, such as from about 1% to about 5% of the remaining undoped thickness of the silicon film 16. In this embodiment, the small portion of the silicon film which has not been doped with phosphorus is removed in order to provide assurance that substantially all of the doped-in phosphorus has been removed from the silicon film. "Substantially all" of the doped-in phosphorus means that in the remaining silicon film 16, the levels of doped-in phosphorus are reduced to less than about 1% of the level at which the silicon film 16 is doped to create its activity. For example, if the silicon film 16 is doped with boron at $1 \times 10^5/cm^3$, removing substantially all of the doped-in phosphorus results in a phosphorus concentration of about $1 \times 10^{13}/cm^3$ or less in the silicon film 16.

The "small portion" of the silicon film which has not been doped which is removed in one embodiment, includes a sufficient amount of the silicon film to provide an acceptable margin of certainty that substantially all of the silicon film which includes doped-in phosphorus has been removed from the SOI wafer. As mentioned above, this amount may be, for example, about 1% to about 5% of the remaining thickness of the monocrystalline silicon film 16. The small portion of the silicon film 16 which is removed in order to remove all of the doped-in phosphorus may be determined in advance, since the diffusion of phosphorus into silicon is consistently repeatable. The concentration of phosphorus in the "small portion" may be in the range of about $1 \times 10^{12}/cm^3$ to about $1 \times 10^{13}/cm^3$. The actual thickness of the doped region 20 and/or the small portion of the undoped silicon film 16 which need to be removed will vary, e.g., with the length of the gettering step and with the uniformity of the polishing equipment, as well as with the level of impurities which is acceptable.

In one embodiment, a sufficient amount of the portion of the silicon film which has not been doped with phosphorus is removed to provide a reasonable margin of certainty that all of the silicon film which includes doped-in phosphorus has been removed from the SOI wafer. In one embodiment, the monocrystalline silicon film remaining after the step of removing includes no detectable phosphorus. The doped-in phosphorus includes phosphorus which was doped into the silicon film by virtue of the phosphorus-containing layer and subsequent treatment steps (such as annealing), but does not include whatever small amount of phosphorus which may be present throughout the silicon film as an impurity. The impurity amount of phosphorus may be determined, for example, by analysis of a portion of the silicon film 16 which is far removed from the phosphorus-containing layer 18, and comparison of this amount with the amount of phosphorus found in the vicinity of the phosphorus-containing layer 18 or of the doped region 20. The portion of the silicon film which must be removed in order to remove all of the doped-in phosphorus may be determined in advance, since the diffusion of phosphorus into silicon is consistently repeatable.

As can be easily understood, in order to remove the portions of the silicon film containing doped-in phosphorus, the silicon film must be initially formed in a thickness which is greater than the desired final thickness. Thus, in one embodiment, the monocrystalline silicon film has an initial thickness in excess of a predetermined final thickness. In one embodiment, removal of the portion of the monocrystalline silicon film leaves a predetermined final thickness of the monocrystalline silicon film. The final thickness of the silicon film may be predetermined based on various considerations known in the art.

The thicknesses of the layers may be as follows. As will be understood by those of skill in the art, thicknesses, along with semiconductor dimensions generally, continue to be reduced. Thus, the following thickness ranges are relative, since size reductions are expected to continue. In one embodiment, the overall thickness of the SOI wafer following application of the method of the present invention is according to the SEMI specification. In one embodiment, the thickness of the SOI wafer following application of the method of the present invention is about 725 microns for an 8 inch wafer.

The thickness of the monocrystalline silicon film is not limiting to the present invention. In one embodiment, the final thickness of the monocrystalline silicon film (device or active layer) is in a range from about 100 to about 1000 angstroms (Å), following application of the method of the present invention. In one embodiment, the final thickness of the monocrystalline silicon film is in a range from about 200 to about 800 Å. In one embodiment, the final thickness of the monocrystalline silicon film is in a range from about 400 to about 600 Å. This thickness is referred to herein as the predetermined final thickness.

In one embodiment, the initial thickness of the monocrystalline silicon film of the SOI wafer prior to application of the method of the present invention is from about 500 to about 1000 Å thicker than the predetermined final thickness. Thus, the initial thickness of the monocrystalline silicon film may range from about 1200 to about 5000 Å in thickness. The thickness of the monocrystalline silicon film removed corresponds generally to the depth of doping of phosphorus into the monocrystalline silicon film. In one embodiment, the additional undoped monocrystalline silicon film which is removed has a thickness from about 10 to about 100 Å.

In one embodiment, the thickness of the buried oxide (BOX) layer ranges from about 200 to about 4000 Å. In one embodiment, the thickness of the buried oxide layer ranges from about 500 to about 2000 Å. In one embodiment, the thickness of the buried oxide layer ranges from about 800 to about 1500 Å.

The silicon substrate 12 constitutes the remainder of the thickness of the SOI wafer.

Figure 5:
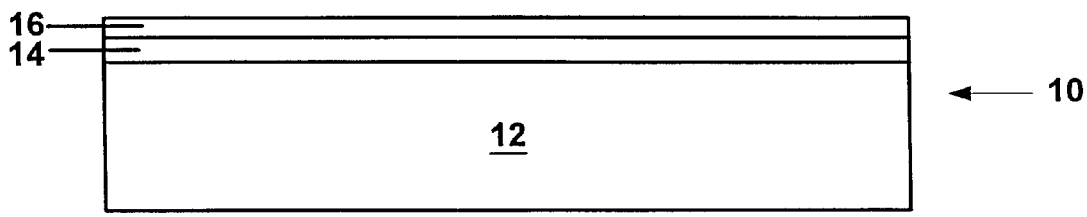
FIG. 5 is a partial cross-sectional view of an SOI wafer following a step of removing a doped portion of the silicon film has been removed in accordance with the present invention.

FIG. 5 shows a partial cross-sectional view of the SOI wafer 10 following a polishing step, in which the doped region 20 of the silicon film 16 has been removed. In one embodiment the step of removing the doped region 20 of the silicon film 16 also removes a small portion of the undoped silicon film 16. As a result of this removing step, a predetermined final thickness of the silicon film 16 remains.

Following the foregoing treatment steps, the SOI wafer 10 may be annealed in order to recrystallize the silicon film 16 into a monocrystalline silicon film. Thereafter, the SOI wafer 10 may be further processed by methods known in the art to prepare the desired semiconductor device comprising an SOI wafer.

Figure 6:
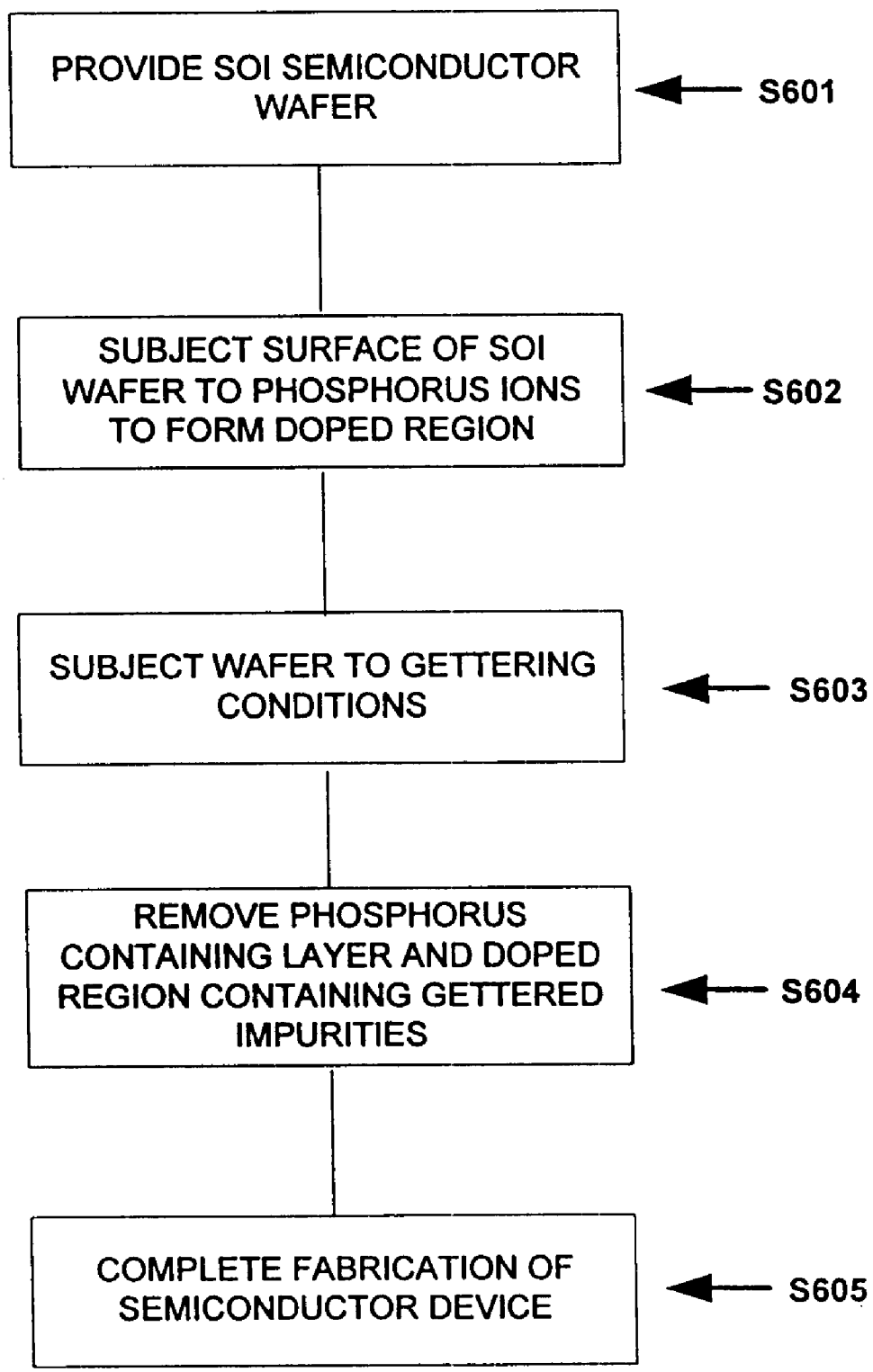
FIG. 6 is a flow diagram of an exemplary process in accordance with the present invention.

FIG. 6 is a flow diagram of an exemplary process in accordance with the present invention. As shown in FIG. 6, in step S601, an SOI semiconductor wafer is provided. The SOI semiconductor wafer may be formed by any method known in the art. In one embodiment, the SOI semiconductor wafer is formed by wafer bonding.

As shown in FIG. 6, in step S602, a surface of the SOI semiconductor wafer is subjected to phosphorus ions, to form a doped region in the monocrystalline silicon active layer. In one embodiment, the source of phosphorus ions is $POCl_3$. In one embodiment, the step of subjecting the surface to phosphorus ions results in the formation of a phosphorus containing layer. In one embodiment, the phosphorus containing layer comprises $P_2O_5$.

As shown in FIG. 6, in step S603, the monocrystalline silicon active layer is subjected to gettering conditions. In one embodiment, the entire SOI wafer is subjected to gettering conditions. As a result of subjecting the layer to gettering conditions, at least one impurity is gettered into the doped region and/or the layer comprising $P_2O_5$, such that the at least one impurity is captured by gettering sites in the doped region and/or the layer comprising $P_2O_5$.

In one embodiment, steps S602 and S603 co-occur, or occur substantially simultaneously. That is, the conditions in the step of subjecting the SO wafer to phosphorus ions constitute gettering conditions, so that the steps of subjecting the SOI wafer to phosphorus ions and of subjecting the SOI wafer to gettering conditions occur at the same time, or substantially simultaneously.

As shown in FIG. 6, in step S604, the doped region and the phosphorus containing layer, when the phosphorus containing layer is present, which contain the gettered impurities, are removed. In one embodiment, in addition to these layers, a portion of the undoped region of the monocrystalline silicon active layer is also removed in the step S604. In one embodiment, the doped region and the phosphorus containing layer are removed by a fluorine-containing etchant. In one embodiment, the doped region and the portion of the undoped region are removed by chemical mechanical polishing.

As shown in FIG. 6, in step S605, fabrication of a semiconductor device is carried out following the foregoing steps of the present invention, steps S601–S604.

What has been described above are certain embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of manufacturing a silicon-on-insulator semiconductor wafer, comprising the steps of:

forming a silicon-on-insulator semiconductor wafer having at least one surface of a monocrystalline silicon film;

contacting the at least one surface with phosphorus ions to form a doped region of the monocrystalline silicon film doped with phosphorus above a region of the monocrystalline silicon film which remains undoped;

subjecting the wafer to conditions to getter at least one impurity from the undoped region into the doped region; and removing a portion of the monocrystalline silicon film including the doped region from the at least one surface, leaving a substantial portion of the monocrystalline silicon film.

2. The method of claim 1, wherein the phosphorus ions are obtained from a source of phosphorus selected from phosphorus oxychloride, $POCl_3$, phosphine ($PH_3$), trimethyl phosphite, $P(OCH_3)_3$, triethyl phosphite, $P(OCH_2CH_3)_3$, trimethyl phosphate, $P(O)(OCH_3)_3$ and triethyl phosphate, $P(O)(OCH_2CH_3)_3$.

3. The method of claim 1, wherein the step of contacting includes formation of a layer of $P_2O_5$ on the at least one surface.

4. The method of claim 3, wherein the layer of $P_2O_5$ is removed by etching with an etchant comprising fluorine.

5. The method of claim 4, wherein the etchant comprises hydrogen fluoride.

6. The method of claim 1, wherein the portion of the monocrystalline silicon film is removed by chemical mechanical polishing.

7. The method of claim 1, wherein the monocrystalline silicon film has an initial thickness in excess of a predetermined final thickness.

8. The method of claim 7, wherein removal of the portion of the monocrystalline silicon film leaves a predetermined final thickness of the monocrystalline silicon film.

9. The method of claim 1, wherein the portion of the monocrystalline silicon film removed includes the doped region and a portion of the undoped region.

10. A method of manufacturing a silicon-on-insulator semiconductor wafer, comprising the steps of:

forming a silicon-on-insulator semiconductor wafer having at least one surface of a monocrystalline silicon film, wherein the monocrystalline silicon film has an initial thickness in excess of a predetermined final thickness;

contacting the at least one surface with phosphorus ions to form a doped region of the monocrystalline silicon film doped with phosphorus above a region of the monocrystalline silicon film which remains undoped;

subjecting the wafer to conditions to getter at least one impurity from the undoped region into the doped region; and removing the doped region and a portion of the undoped region from the surface, leaving the predetermined final thickness of the monocrystalline silicon film.

11. The method of claim 10, wherein the phosphorus ions are obtained from a source of phosphorus selected from phosphorus oxychloride, $POCl_3$, phosphine ($PH_3$), trimethyl phosphate, $P(OCH_3)_3$, triethyl phosphate, $P(OCH_2CH_3)_3$, trimethyl phosphate, $P(O)(OCH_3)_3$ and triethyl phosphate, $P(O)(OCH_2CH_3)_3$.

12. The method of claim 10, wherein the step of contacting includes formation of a layer of $P_2O_5$ on the at least one surface.

13. The method of claim 12, wherein the layer of $P_2O_5$ is removed by etching with an etchant comprising fluorine.

14. The method of claim 13, wherein the steps of contacting the at least one surface with phosphorus ion and of subjecting the wafer to gettering conditions take place simultaneously.

15. The method of claim 10, wherein the portion of the monocrystalline silicon film is removed by chemical mechanical polishing.

16. A method of manufacturing a silicon-on-insulator semiconductor wafer, comprising the steps of:

forming a silicon-on-insulator semiconductor wafer having at least one surface of a monocrystalline silicon film, wherein the monocrystalline silicon film has an initial thickness in excess of a predetermined final thickness, and the monocrystalline silicon film contains an initial concentration of at least one impurity;

contacting the at least one surface with phosphorus ions to form a doped region of the monocrystalline silicon film doped with phosphorus above a region of the monocrystalline silicon film which remains undoped;

subjecting the wafer to conditions to getter the at least one impurity from the undoped region into the doped region; and removing the doped region and a portion of the undoped region from the surface, leaving the predetermined final thickness of the monocrystalline silicon film, wherein the final thickness of the monocrystalline film contains a concentration of the at least one impurity substantially lower than the initial concentration of the at least one impurity.

17. The method of claim 16, wherein the phosphorus ions are obtained from a source of phosphorus selected from phosphorus oxychloride, $POCl_3$, phosphine ($PH_3$), trimethyl phosphite, $P(OCH_3)_3$, triethyl phosphite, $P(OCH_2CH_3)_3$, trimethyl phosphate, $P(O)(OCH_3)_3$ and triethyl phosphate, $P(O)(OCH_2CH_3)_3$.

18. The method of claim 16, wherein the step of contacting includes formation of a layer of $P_2O_5$ on the at least one surface.

19. The method of claim 16, wherein the portion of the monocrystalline silicon film is removed by chemical mechanical polishing.

20. The method of claim 16, wherein the steps of contacting the at least one surface with phosphorus ion and of subjecting the wafer to gettering conditions take place simultaneously.

* * * * *